United States Patent [19]
Tamaki

[11] Patent Number: 6,144,196
[45] Date of Patent: Nov. 7, 2000

[54] MAGNETIC FIELD MEASURING APPARATUS AND APPARATUS FOR MEASURING SPATIAL RESOLUTION OF MAGNETIC FIELD DETECTOR

[75] Inventor: Naoya Tamaki, Tokyo, Japan

[73] Assignee: NEC Corporation, Tokyo, Japan

[21] Appl. No.: 09/118,085

[22] Filed: Jul. 17, 1998

[30] Foreign Application Priority Data

Jul. 23, 1997 [JP] Japan .................................. 9-197125

[51] Int. Cl.$^7$ .................................................. G01R 33/00
[52] U.S. Cl. ........................ 324/117 R; 324/96; 324/244
[58] Field of Search ........................... 324/117 R–117 H, 324/127, 96, 142, 244, 260

[56] References Cited

U.S. PATENT DOCUMENTS 4,324,255  4/1982  Barach et al. ....................... 324/117 R

OTHER PUBLICATIONS

Takashi Harada et al., "Time Domain Magnetic Field Waveform Measurement Near Printed Circuit Boards", T. IEE Japan, vol. 117–A, No. 5, 1997, pp. 523–530.
John D. Dyson, "Measurement of Near Fields of Antennas and Scatters", IEEE Transaction on Antennas and Propagation, vol. AP–21, No. 4, Jul. 1973, pp. 446–460.

*Primary Examiner*—Jay Patidar
*Attorney, Agent, or Firm*—Young & Thompson

[57] ABSTRACT

A magnetic measuring apparatus measures, at a high spatial resolution, a magnetic field generated by a current flowing in one of a plurality of highly packed parallel wires on a printed-circuit board. The magnetic measuring apparatus includes a magnetic field detector for detecting a magnetic field generated by a current flowing in one of a plurality of parallel wires, a measuring unit for measuring a magnetic field intensity based on an output signal from the magnetic field detector, an input unit for entering a pitch of the parallel wires and a spatial resolution characteristic of the magnetic field detector, a processor for calculating a height of the magnetic field detector from the one of the parallel wires based on the pitch of the parallel wires and the spatial resolution characteristic, and a scanning device for scanning the magnetic field detector into a position determined by the processor. The height of the magnetic field detector is adjusted such that a location where magnetic fields generated by a current flowing in one of the wires and a mirror-image current symmetrical with respect to a ground surface cancel each other is brought into agreement with the position of an adjacent wire, for thereby suppressing the effect of a magnetic field from the adjacent wire.

9 Claims, 9 Drawing Sheets

```
positioning magnetic field detector
field by scanning device above the wire
to be measured and bringing as closely
to the wire as possible
            │
            ▼
    detecting the
    intensity of
    magnetic field
    by detector
            │
            ▼
   measuring the magnetic
   field including the effect
   of the adjacent wire
```

———— adjacent wire presence

-------- absence

———— adjacent wire presence
-------- absence

———— adjacent wire presence
-------- absence

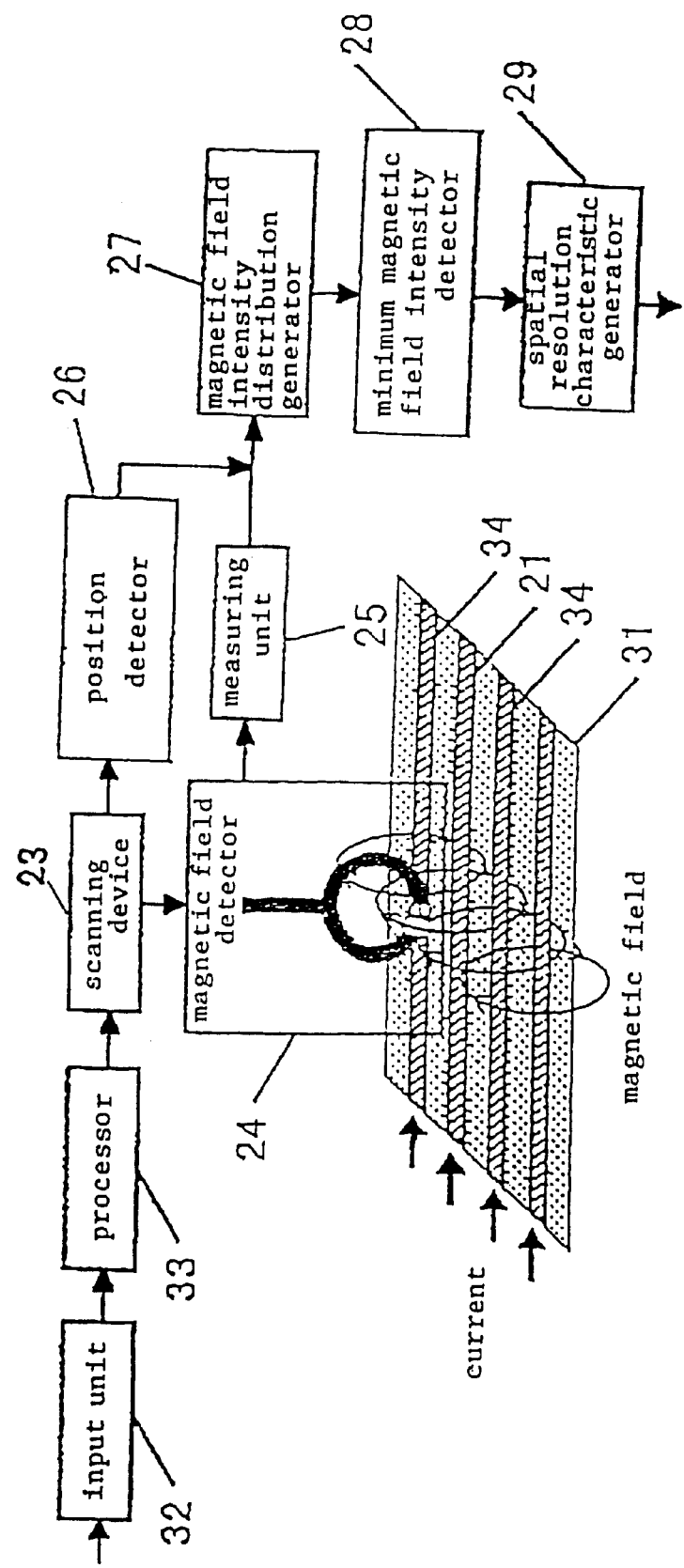

MAGNETIC FIELD MEASURING APPARATUS AND APPARATUS FOR MEASURING SPATIAL RESOLUTION OF MAGNETIC FIELD DETECTOR

BACKGROUND OF THE INVENTION

1. Field of the Invention

The present invention relates to a magnetic field measuring apparatus for measuring a magnetic field generated by a current flowing in one of a plurality of parallel wires without being affected by magnetic fields generated by adjacent wires, and an apparatus for measuring the spatial resolution of a magnetic field detector.

2. Description of the Related Art

Heretofore, magnetic field detectors for measuring currents flowing in wires on printed-circuit boards, etc. have typically been of a shielded-loop design having a formed semirigid coaxial line as disclosed in "Measurement of Near Fields of Antennas and Scatters" (IEEE TRANSACTIONS ON ANTENNAS AND PROPAGATION, VOL. AP-21, NO. 4, JULY 1973, pp 446–460, for example. According to a magnetic field measuring process effected by the shielded-loop magnetic field detector, it is general practice to fix the magnetic field detector directly above a wire and determine a current flowing in the wire from the measured magnetic field based on the Ampere's rule. Actually, the magnetic field detector detects a voltage depending on the magnetic field, and hence it is necessary to determine in advance a coefficient for converting an output voltage of the magnetic field detector into a corresponding magnetic field, as disclosed in "Time Domain Magnetic Field Waveform Measurement near Printed Circuit Boards", (T. IEE Japan, Vol. 117-A, NO. 5, May 1997, pp 523–530).

FIG. 1 of the accompanying drawings shows such a conventional shielded-loop magnetic field detector. As shown in FIG. 1, a looped coaxial line 101 has terminal ends 102 short-circuited to each other or terminated with a non-reflective terminator. The looped coaxial line 101 has a lowermost end to be placed most closely to a wire to be measured, the lowermost end having a gap 104 leaving a central conductor 103. The central conductor 103 and an outer conductor are short-circuited to each other at a terminal portion 105 of the gap 104. The magnetic field detector produces an output signal commensurate with a magnetic flux that runs across a loop plane 106. If the magnetic field detector is to measure a magnetic field produced by one of a plurality of parallel wires, it is necessary to reduce the size of the loop plane 106 and bring the loop plane closely to the wire to be measured in order to increase the spatial resolution of the magnetic field detector.

FIG. 2 of the accompanying drawings shows a measuring sequence of the shielded-loop magnetic field detector shown in FIG. 1. According to the measuring sequence, the magnetic field detector fixed by a scanning device is positioned directly above the wire to be measured and brought as closely to the wire as possible, and measures a magnetic field in the vicinity of the wire.

If there are no any other wires on the printed-circuit board than the wire to be measured or any other wires on the printed-circuit board are sufficiently spaced from the wire to be measured, then the magnetic field detector can measure the magnetic field produced by the wire without concern over any special considerations. However, if there is an adjacent wire closely to the wire to be measured, then the magnetic field detector detects a combination of magnetic fields produced by both the wires. Therefore, for measuring only the magnetic field produced by the wire to be measured, it is necessary to minimize the magnetic field detector as much as possible and bring the magnetic field detector as closely to the wire to be measured as possible. Since, however, the magnetic field generated due to the current flowing in the wire has a certain spatial distribution, there is a certain limitation on efforts to suppress the effect of the adjacent wire if only the above requirements are met.

SUMMARY OF THE INVENTION

It is therefore an object of the present invention to provide a magnetic field detecting apparatus for measuring a magnetic field at a high spatial resolution with a current flowing in one of a plurality of parallel wires without being affected by magnetic fields generated by adjacent wires, and an apparatus for measuring the spatial resolution of a magnetic field detector.

According to an aspect of the present invention, a magnetic field measuring apparatus includes a magnetic field detector for detecting a magnetic field generated by a current flowing in one of a plurality of parallel wires, a measuring unit for measuring a magnetic field intensity based on an output signal from the magnetic field detector, an input unit for entering a pitch of the parallel wires and a spatial resolution characteristic of the magnetic field detector, a processor for calculating a height of the magnetic field detector from the one of the parallel wires based on the pitch of the parallel wires and the spatial resolution characteristic, and a scanning device for scanning the magnetic field detector into a position determined by the processor.

According to another aspect of the present invention, an apparatus for measuring the spatial resolution of a magnetic field detector includes a magnetic field detector for detecting a magnetic field generated by a current flowing in a wire, a measuring unit for measuring a magnetic field intensity based on an output signal from the magnetic field detector, a magnetic field intensity distribution generator for generating a magnetic field intensity distribution parallel to a plane of the wire in a direction perpendicular to the wire, a minimum magnetic field intensity detector for outputting a position of the magnetic field detector where the magnetic field intensity is minimum, a spatial resolution characteristic generator for generating a characteristic at different heights from the plane of the wire as a spatial resolution characteristic of the magnetic field detector with respect to the height thereof, a three-dimensional scanning device for scanning the magnetic field detector along an axis of the wire, an axis of a straight line perpendicular to the wire, and an axis of the height from the plane of the wire, and a position detector for detecting a position of the magnetic field detector.

According to still another aspect of the present invention, a magnetic field measuring apparatus includes a magnetic field detector for detecting a magnetic field generated by a current flowing in one of a plurality of parallel wires, a measuring unit for measuring a magnetic field intensity based on an output signal from the magnetic field detector, an input unit for entering a pitch of the parallel wires and a spatial resolution characteristic of the magnetic field detector, a processor for calculating a height of the magnetic field detector from the one of the parallel wires based on the pitch of the parallel wires and the spatial resolution characteristic, a scanning device for three-dimensionally scanning the magnetic field detector into a position determined by the processor along an axis of the wires, an axis of a straight line perpendicular to the wires, and an axis of the height from the plane of the wires, a magnetic field intensity distribution generator for generating a magnetic field intensity distribution parallel to a plane of the wires in a direction perpendicular to the wires, a minimum magnetic field intensity detector for outputting a position of the magnetic field detector where the magnetic field intensity is minimum, a spatial resolution characteristic generator for generating a characteristic at different heights from the plane of the wires as a spatial resolution characteristic of the magnetic field detector with respect to the height thereof, and outputting the generated characteristic to the input unit, and a position detector for detecting a position of the magnetic field detector.

If a wire to be measured on a printed-circuit board is flanked by an adjacent wire, the magnetic field measuring apparatus and the apparatus for measuring the spatial resolution of a magnetic field detector according to the present invention make it possible to measure a magnetic field generated by a current flowing in the wire at a high spatial resolution without being affected by a magnetic field generated by a current flowing in the adjacent wire.

The above and other objects, features and advantages of the present invention will become apparent from the following description with reference to the accompanying drawings which illustrate examples of the present invention.

BRIEF DESCRIPTION OF THE DRAWINGS

FIG. 15 is a block diagram of a magnetic field detecting apparatus incorporating an apparatus for measuring the spatial resolution of a magnetic field detector.

DETAILED DESCRIPTION OF THE PREFERRED EMBODIMENT

Figures 1, 2:
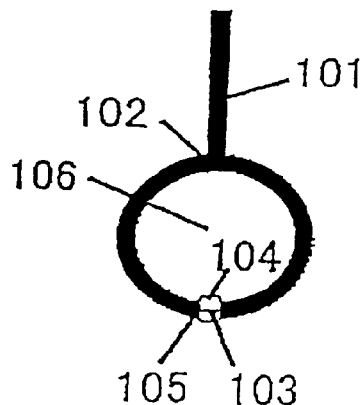
FIG. 1 is a view of a conventional shielded-loop magnetic field detector having a formed semirigid coaxial line.
FIG. 2 is a conventional flowchart of a measuring sequence for measuring a magnetic field with a current in a wire using the shielded-loop magnetic field detector.

Like or corresponding parts are denoted by like or corresponding reference numerals throughout views.

The principles and embodiments of the present invention will be described in detail below with reference to the drawings.

Figure 3:
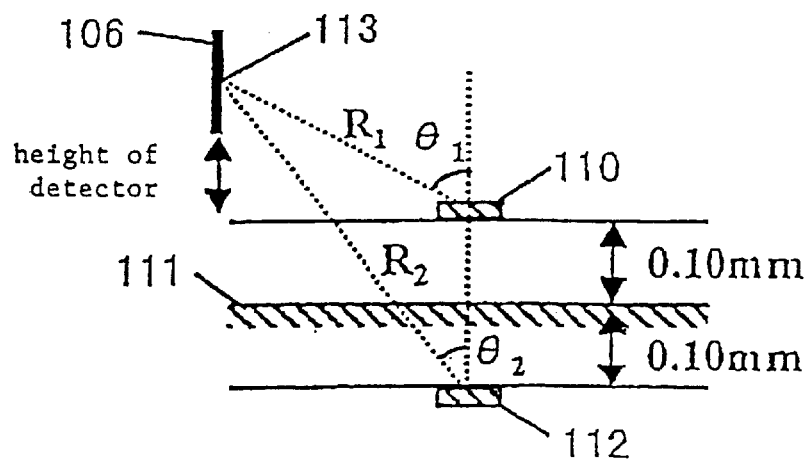
FIG. 3 is a diagram showing a model for calculating a magnetic field intensity distribution perpendicular to a wire.

Wires on the surface of printed-circuit boards comprise primarily microstrip lines. A process of theoretically determining a magnetic field generated by a current flowing in a microstrip line is illustrated by a model shown in FIG. 3. FIG. 3 shows the model in a cross section of a printed-circuit board. In the model, a current I flows in a wire 110, and a mirror-image current −I flows in a hypothetical wire 112, the wires 110, 112 being symmetrical with respect to a ground surface 111. A magnetic field detector disposed above the wire 110 has a loop plane 106 having an observation point 113 at its center. It is known that a magnetic field detected at the observation point 113 is represented by the sum of magnetic fields due to the currents I, −I. If it is assumed that the observation point 113 is spaced from the wire 110 by a distance $R_1$ and angularly spaced from a vertical line through the wire 110 by an angle $\theta_1$, and the observation point 113 is spaced from the hypothetical wire 112 by a distance $R_2$ and angularly spaced from the vertical line through the hypothetical wire 112 by an angle $\theta_2$, then a horizontal component (x component) $H_x$ of a field intensity H at the observation point 113 is expressed by:

$$H_x = I \cos \theta_1 / 2\pi R_1 - I \cos \theta_2 / 2\pi R_2 \qquad (1)$$

on the assumption that the wires are sufficiently long and the ground surface 111 has a sufficiently large area.

Figure 4:
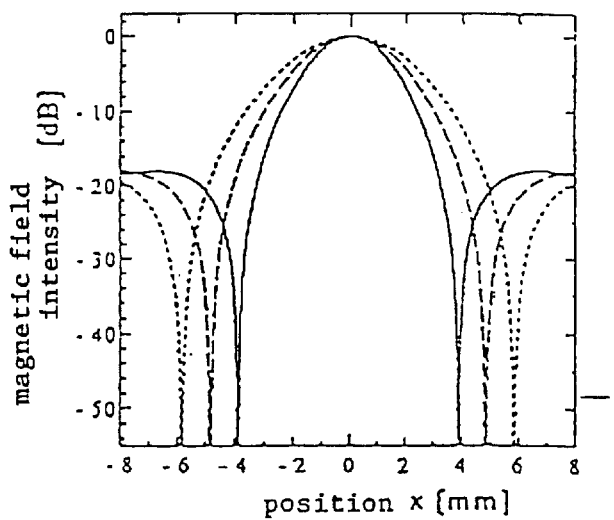
FIG. 4 is a diagram showing a magnetic field intensity distribution calculated when a magnetic field detector is scanned in a direction perpendicular to an wire.

FIG. 4 shows a magnetic field intensity distribution calculated when the observation point 113 is scanned along the plane of the wire 110 in a direction perpendicular to the wire 110, using the height from the wire 110 as a parameter, i.e., at each of different heights from the wire 110. In FIG. 4, the position immediately above the wire 110 is indicated by x=0, and the field intensity is standardized by a maximum value thereof. It can be seen from the magnetic field intensity distribution shown in FIG. 4 that the higher the observation point 113 is spaced from the wire 110, the wider the magnetic field intensity distribution becomes. Each of the plotted magnetic field intensity distributions has a location where the magnetic fields generated by the currents I, −I cancel each other. In such a location, the following equation is satisfied:

$$\cos \theta_1 / R_1 = \cos \theta_2 / R_2 \qquad (2)$$

When the equation (2) is satisfied, the horizontal component $H_x$ is $H_x = 0$. According to this equation, it is considered that the effect of a magnetic field due to an adjacent wire is suppressed if the adjacent wire is positioned in the above location. Specifically, the effect of a magnetic field due to an adjacent wire can be eliminated if the magnetic field detector is positioned directly above a wire to be measured on a printed-circuit board and the height of the magnetic field detector is adjusted such that the location where the magnetic field intensity shown in FIG. 4 is minimum will correspond to the position of the adjacent wire. The coordinate, where the magnetic field intensity is minimum, in the direction perpendicular to the wire is defined as the spatial resolution of the magnetic field intensity. The above requirement to be met for suppressing the effect of a magnetic field due to an adjacent wire varies depending on the size and shape of the loop plane 106 of the magnetic field detector. Therefore, it is necessary to determine the magnetic field intensity shown in FIG. 4 for each magnetic field detector to be used.

Embodiment 1: The spatial resolution of a magnetic field detector is unknown.

Figure 5:
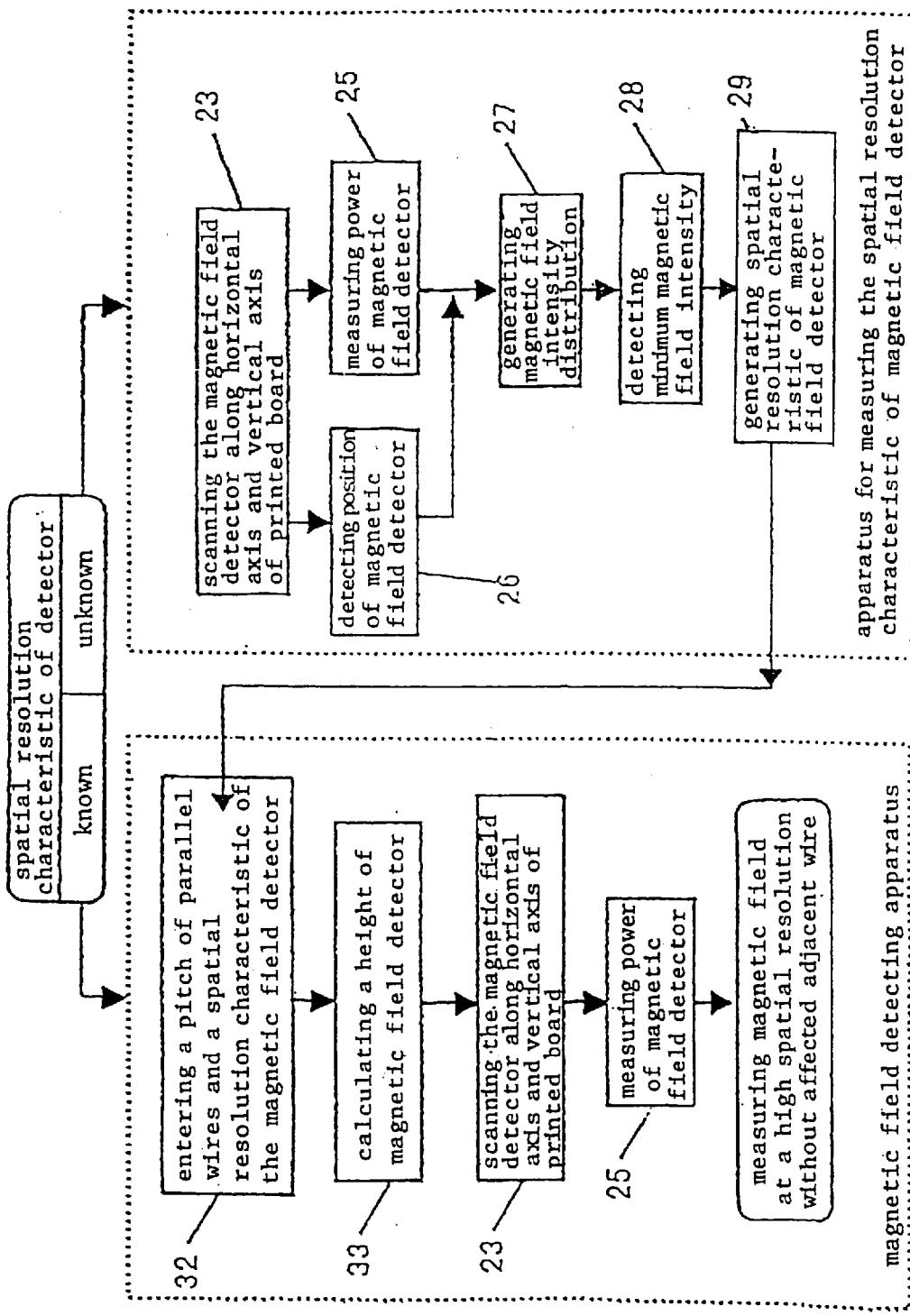
FIG. 5 is a flowchart of a measuring sequence for measuring a magnetic field with a current in a wire according to the present invention.

FIG. 5 shows a measuring sequence for measuring a magnetic field with a current in a wire according to the present invention. If the spatial resolution of a magnetic field detector is unknown when a magnetic field generated by a current flowing in one of a plurality of parallel wires is to be measured, it is necessary that the spatial resolution of the magnetic field detector be determined by an apparatus for measuring the spatial resolution of a magnetic field detector according to the present invention.

Figure 6:
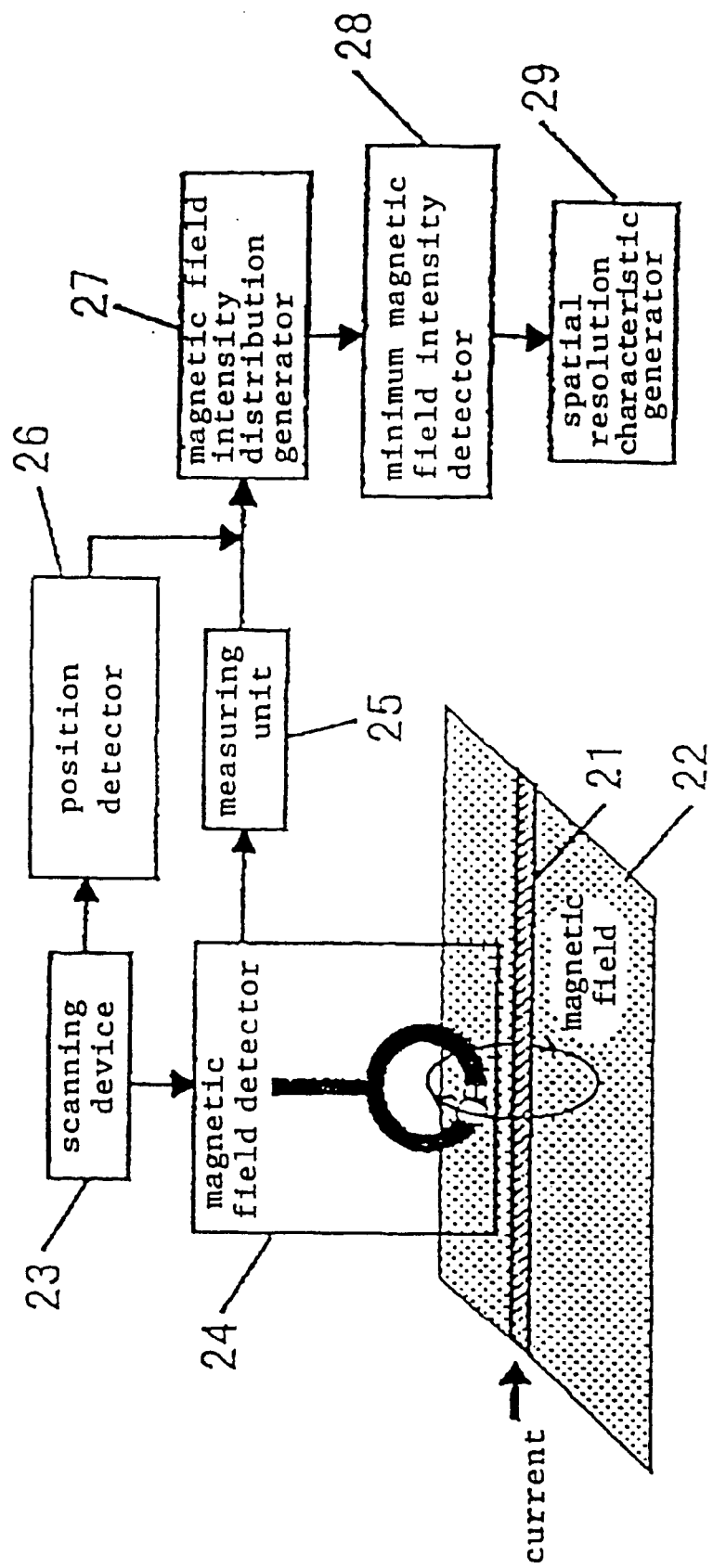
FIG. 6 is a block diagram of an apparatus for measuring the spatial resolution of a magnetic field detector according to the present invention.

FIG. 6 shows in block form such an apparatus for measuring the spatial resolution of a magnetic field detector according to the present invention. As shown in FIG. 6, the apparatus comprises a scanning device 23 disposed above a printed-circuit board 22 having a single wire 21 and operable for scanning movement in three axis directions, a magnetic field detector 24 fixed by the scanning device 23, a measuring unit 25 connected to the magnetic field detector 24, a position detector 26 for detecting the scanning position of the scanning device 23, a magnetic field intensity distribution generator 27 for generating a magnetic field intensity pattern based on an output signal from the measuring unit 25 and the detected scanning position of the scanning device 23, a minimum magnetic field intensity detector 28 for detecting a minimum magnetic field intensity from the generated magnetic field intensity distribution, and a spatial resolution characteristic generator 29 for generating a spatial resolution characteristic of the magnetic field detector.

An operation sequence of the spatial resolution apparatus in the case where the spatial resolution of the magnetic field detector is unknown is shown in FIG. 5. According to the illustrated operation sequence, the magnetic field detector 24 is fixed at a certain height from the printed-circuit board 22 by the scanning device 23, and measures a magnetic field intensity when the magnetic field detector 24 is scanned parallel to the plane of the wire 21 in a direction perpendicular to the wire 21. Then, a magnetic field intensity distribution perpendicular to the wire 21 is generated from the output signal and position of the magnetic field detector 24. The height of the magnetic field detector 24 at this time and a position spaced from the wire 21 where the magnetic field intensity is minimum are detected, and the spatial resolution characteristic of the magnetic field detector 24 used is generated from the detected height and position. The same process is carried out at different heights of the magnetic field detector 24.

Figure 8:
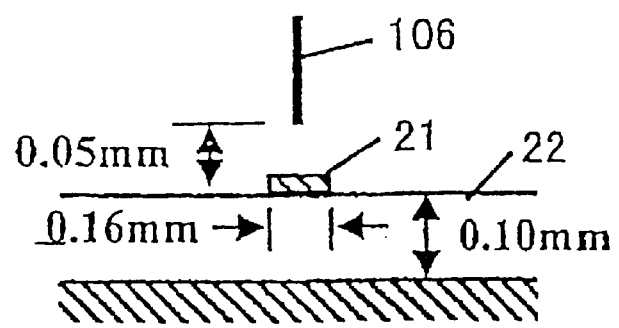
FIG. 8 is a diagram showing a model for measuring a magnetic field intensity distribution.
Figure 9:
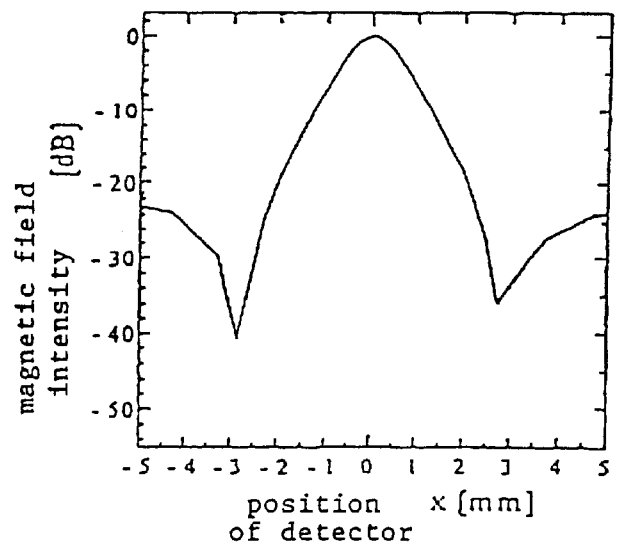
FIG. 9 is a diagram showing a magnetic field intensity distribution measured when a magnetic field detector is scanned in a direction perpendicular to a wire.
Figure 10:
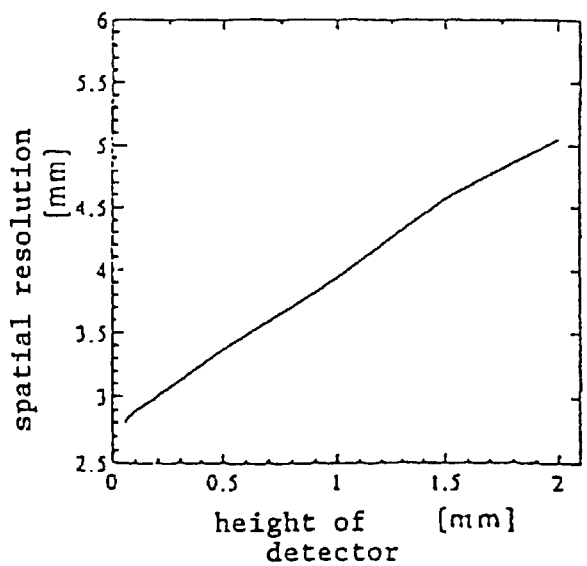
FIG. 10 is a diagram of a measured spatial resolution with respect to the height of the magnetic field detector.

An example in which a conventional shielded-loop magnetic field detector with a formed semirigid coaxial line as shown in FIG. 1 is used for measuring a magnetic field generated by a current in a wire will be described below. As shown in FIG. 8, the lowermost end of a shielded-loop magnetic field detector 24 is fixed at a height of 0.05 mm from a wire 21. A magnetic field intensity distribution detected by the shielded-loop magnetic field detector 24 shown in FIG. 8 is illustrated in FIG. 9. It can be seen from the magnetic field intensity distribution shown in FIG. 9 that a lateral coordinate where the magnetic field intensity is minimum is 2.85 mm. Magnetic field intensity distributions are similarly determined at different heights of the loop plane 106 of the shielded-loop magnetic field detector 24. FIG. 10 shows a spatial resolution characteristic of the shielded-loop magnetic field detector 24 in which the height of the shielded-loop magnetic field detector 24 is related to the position in the lateral direction of the wire where the magnetic field intensity is minimum.

Embodiment 2: The spatial resolution of a magnetic field detector is known as determined by the spatial resolution measuring apparatus according to the embodiment 1.

Figure 7:
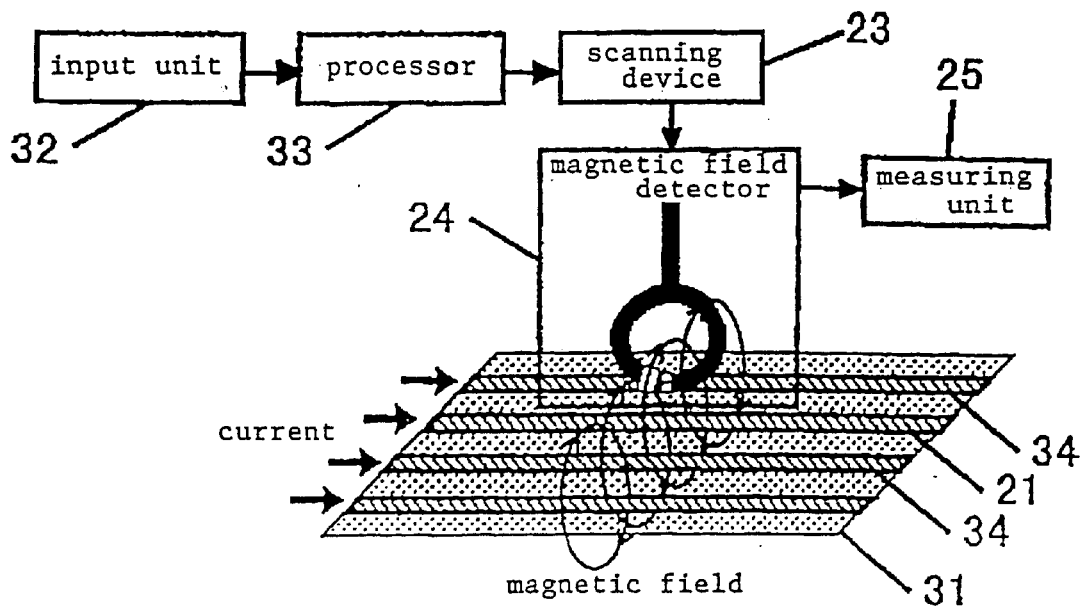
FIG. 7 is a block diagram of a magnetic field detecting apparatus according to the present invention.

If the spatial resolution of a magnetic field detector is known as determined by the spatial resolution measuring apparatus according to the embodiment 1, then a magnetic field generated by a current flowing in one of wires on a printed-circuit board can be measured by a magnetic field measuring apparatus according to the present invention. FIG. 7 shows in block form such a magnetic field detecting apparatus according to the present invention. As shown in FIG. 7, a magnetic field detector 24 is fixed by a scanning device 23 operable for scanning movement in three axis directions, above a wire 21 on a printed-circuit board 31 which supports a plurality of wires. The magnetic field detector 24 has an output terminal connected to a measuring unit 25. An input unit 32 is connected through a processor 33 to the scanning device 23.

An operation sequence of the magnetic field measuring apparatus in the case where the spatial resolution of the magnetic field detector is known is also shown in FIG. 5. According to the operation sequence, the pitch of wires on the printed-circuit board and the spatial resolution characteristic shown in FIG. 10 of the magnetic field detector 24 that is used are entered into the input unit 32. The processor 33 refers to the pitch and the spatial resolution characteristic which have been entered, and derives the height of the magnetic field detector 24 at which the pitch and the spatial resolution characteristic agree with each other. The scanning device 23 scans the magnetic field detector 24 immediately above the wire 21, and also at the height of the magnetic field detector 24 which has been derived by the processor 33. Under this optimum measuring condition, the measuring unit 25 can measure a magnetic field generated by a current flowing in the wire 21 while minimizing the effect of a current flowing in adjacent wires 34.

Figure 11:
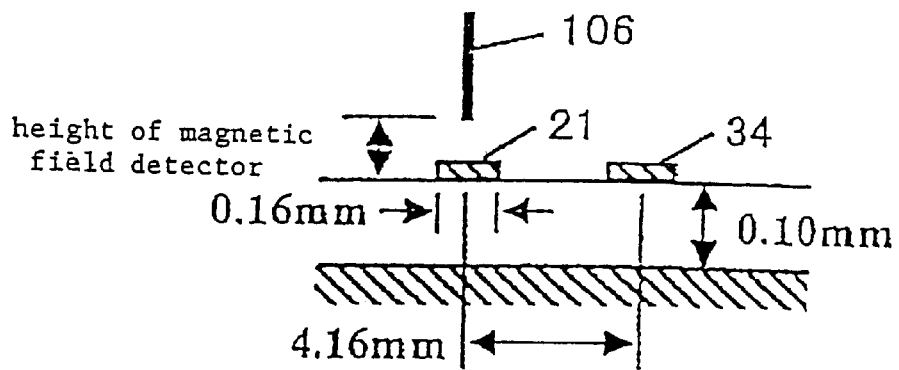
FIG. 11 is a diagram showing a measuring model using the height of the magnetic field detector as a parameter.
Figure 12:
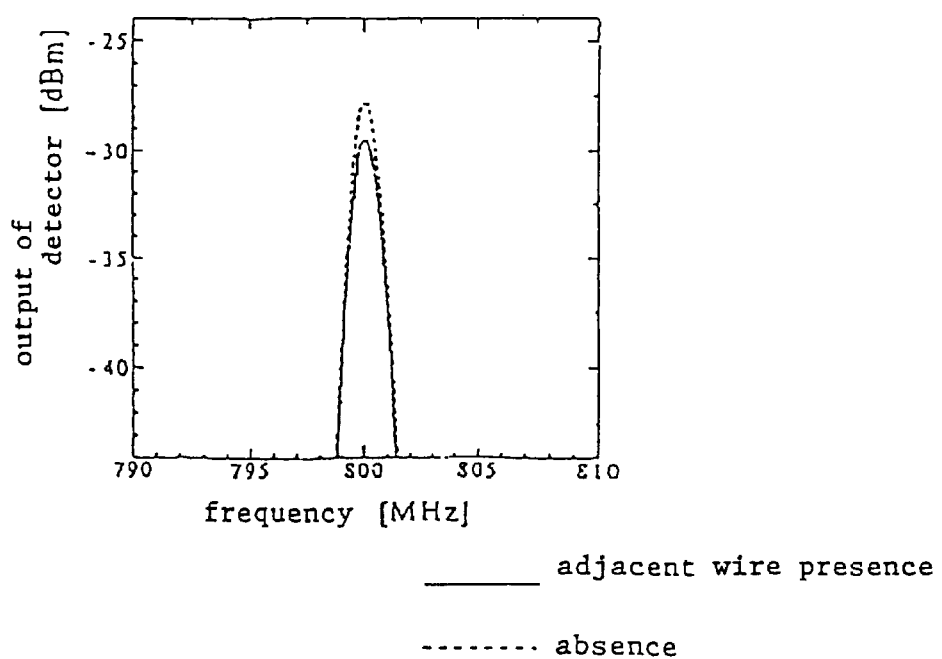
FIG. 12 is a diagram of the spectrums of output signals from the magnetic field detector when the height of the magnetic field detector is 0.05 mm.
Figure 13:
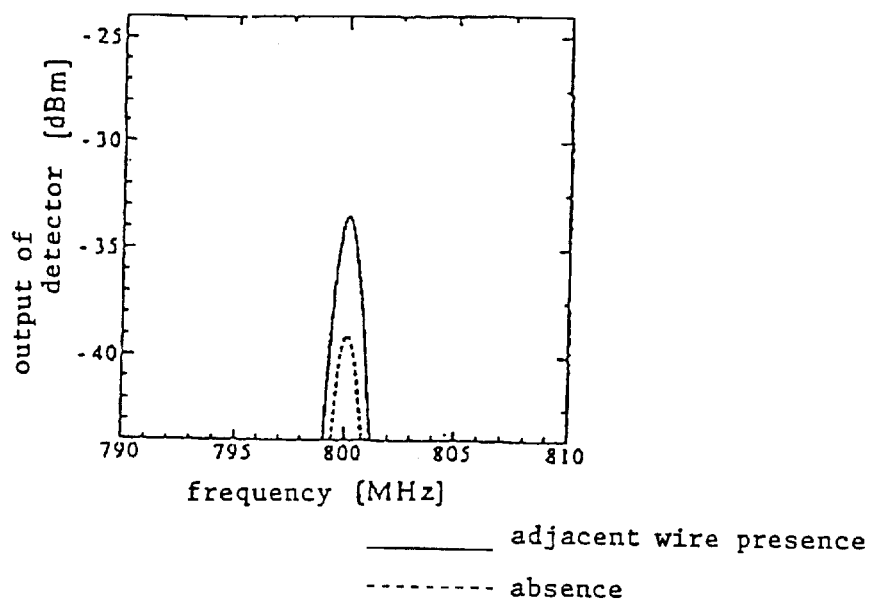
FIG. 13 is a diagram of the spectrums of output signals from the magnetic field detector when the height of the magnetic field detector is 2.00 mm.

An example in which the above shielded-loop magnetic field detector as shown in FIG. 1 is used for measuring a magnetic field generated by a current in the wire 21 flanked by the adjacent wires 34 will be described below. FIG. 11 shows a measuring model, in the cross section of a printed-circuit board, where two wires 21, 34 are spaced from each other at a pitch of 4.16 mm. The left-hand wire 21, which is a wire to be measured, is excited by a sine-wave signal at 800 MHz and −1 dBm, and the right-hand wire 34 is excited by a sine-wave signal at 800 MHz and 9 dBm. An amplifier having a gain of about 20 dB is connected between the magnetic field detector 24 and the measuring unit (comprising a power meter) 25. If only a magnetic field generated by a current flowing in the left-hand wire 21 is to be measured in the measuring model, it has heretofore been customary to position the magnetic field detector 24 directly above and as closely to the wire 21 as possible. The spectrum of an output signal from the magnetic field detector 24 thus positioned at a height of 0.05 mm is indicated by the solid-line curve in FIG. 12. The spectrum of an output signal from the magnetic field detector 24 thus positioned at a height of 0.05 mm in the absence of the adjacent wire 34 is indicated by the dotted-line curve in FIG. 12. As shown in FIG. 12, the amplitudes of the output signals differ from each other by about 1.7 dB. Therefore, if the magnetic field detector 24 were placed only as closely to the wire 21, it would be affected by the adjacent wire 34, and the magnetic field detector 24 would produce an output signal representing the sum of the magnetic fields generated by the currents flowing in the wires 21, 34. The spectrums of output signals from the magnetic field detector 24 positioned at a height of 2.00 mm in the presence and absence of the adjacent wire 34 are shown in FIG. 13. As shown in FIG. 13, the amplitudes of the output signals differ from each other by about 5.5 dB, indicating that the magnetic field detector 24 is affected by the adjacent wire 34.

Figure 14:
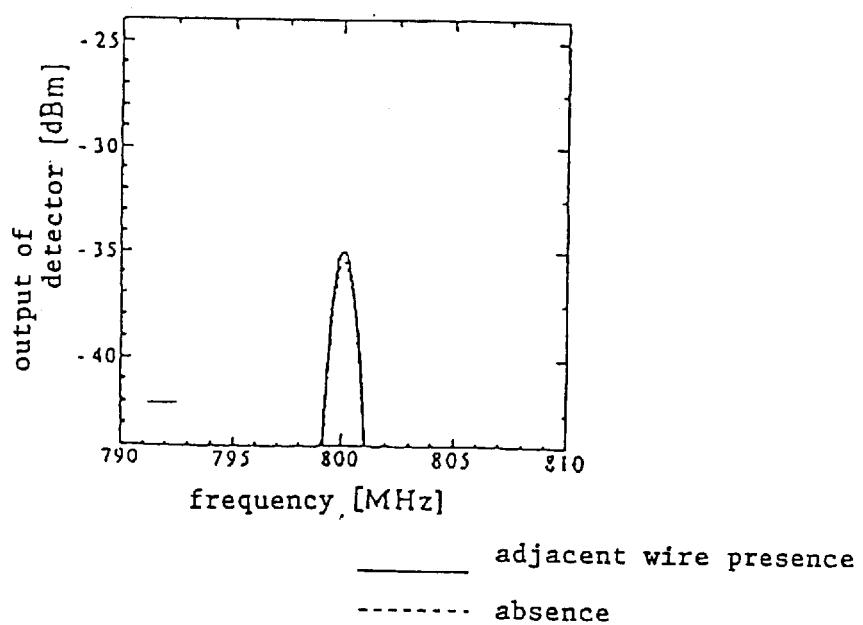
FIG. 14 is a diagram of the spectrums of output signals from the magnetic field detector when the height of the magnetic field detector is 1.14 mm.

If the magnetic field detector 24 whose spatial resolution is known as determined by the spatial resolution measuring apparatus according to the embodiment 1, then the above problem can be solved by positioning the magnetic field detector 24 at a height which provides an optimum measuring condition obtained from the spatial resolution characteristic shown in FIG. 10 and the pitch of the wires on the printed-circuit board. If the magnetic field detector 24 whose spatial resolution is unknown, then the spatial resolution characteristic thereof is determined by the spatial resolution measuring apparatus according to the embodiment 1, and thereafter the magnetic field detector 24 is used according to the embodiment 2. FIG. 10 indicates that the shielded-loop magnetic field detector can eliminate the effect of the adjacent wires 34 at the pitch of 4.16 mm when the height of the shielded-loop magnetic field detector is about 1.14 mm. The spectrums of output signals from the magnetic field detector 24 positioned at the height of 1.14 mm above the wire 21 in the presence and absence of the adjacent wire 34 are shown in FIG. 14. The solid-line curve represents the output signal produced by the magnetic field detector 24 when the magnetic field detector 24 is at the height of 1.14 mm in the presence of the adjacent wire 34, and the dotted-line curve represents the output signal produced by the magnetic field detector 24 when the magnetic field detector 24 is at the height of 1.14 mm in the absence of the adjacent wire 34. As shown in FIG. 14, the amplitudes of the output signals differ from each other by about 0.5 dB, indicating that the effect of the adjacent wire 34 on the magnetic field detector 24 is much smaller than if the magnetic field detector 24 were closer to the wire (at the height of 0.05 mm) or farther from the wire (at the height of 2.00 mm).

Embodiment 3: Magnetic measuring apparatus based on the embodiments 1 and 2.

As shown in FIG. 15, a magnetic measuring apparatus according to the embodiment 3 serves to detect a magnetic field with a current flowing in one of a plurality of parallel wires. The magnetic measuring apparatus comprises a magnetic field detector 24, a measuring unit 25, an input unit 32 for entering the pitch of parallel wires and the spatial resolution characteristic of the magnetic field detector 24 used, a processor 33 for calculating a height from the wires based on the pitch of parallel wires and the resolution characteristic of the magnetic field detector 24, a scanning device 23 for scanning the magnetic field detector 24 into a position determined by the processor 33, a magnetic field intensity distribution generator 27 for generating a magnetic field intensity distribution parallel to the plane of the wires in a direction perpendicular thereto, a minimum magnetic field intensity detector 28 for outputting a position of the magnetic field detector 24 where the magnetic field intensity is minimum, a spatial resolution characteristic generator 29 for outputting a spatial resolution characteristic corresponding to the height from the plane of the wires to the input unit 32, and a position detector 26 for detecting the position of the magnetic field detector 24.

With the arrangement of the present invention, since a magnetic field intensity distribution produced when a magnetic field detector is scanned in a direction perpendicular to a wire contains a location where magnetic fields produced by a current flowing in the wire and a mirror-image current cancel each other, minimizing the magnetic field intensity, the effect of a magnetic field generated by an adjacent wire can be suppressed if the adjacent wire is disposed in such a location. Inasmuch as the location indicative of the minimum value of the magnetic field intensity distribution is varied when the height of the magnetic field detector is varied, the effect of the magnetic field generated by the adjacent wire can be suppressed if the height of the magnetic field detector is varied depending on the pitch of the wires.

While preferred embodiments of the present invention have been described using specific terms, such description is for illustrative purposes only, and it is to be understood that changes and variations may be made without departing from the spirit or scope of the following claims.

What is claimed is:

1. A magnetic field measuring apparatus comprising:
    a magnetic field detector for detecting a magnetic field generated by a current flowing in one of a plurality of parallel wires;
    a measuring unit for measuring a magnetic field intensity based on an output signal from said magnetic field detector;
    an input unit for entering a pitch of the parallel wires and a spatial resolution characteristic of said magnetic field detector;
    a processor for calculating a height of said magnetic field detector from said one of the parallel wires based on said pitch of the parallel wires and said spatial resolution characteristic; and
    a scanning device for scanning said magnetic field detector into a position determined by said processor.

2. A magnetic field measuring apparatus according to claim 1, wherein the position of said magnetic field detector where the magnetic field intensity is minimum in a magnetic field intensity distribution parallel to a plane of the wires in a direction perpendicular to the wires is defined as a spatial resolution of the magnetic field detector with respect to the height from said plane of the wires, and a characteristic determined at different heights from said plane of the wires is defined as a spatial resolution characteristic of said magnetic field detector.

3. A magnetic field measuring apparatus according to claim 1, wherein said scanning device comprises:
    a scanning device for three-dimensionally scanning said magnetic field detector along an axis of said wires, an axis of a straight line perpendicular to said wires, and an axis of the height from said plane of the wires.

4. An apparatus for measuring the spatial resolution of a magnetic field detector, comprising:
    a magnetic field detector for detecting a magnetic field generated by a current flowing in a wire;
    a measuring unit for measuring a magnetic field intensity based on an output signal from said magnetic field detector;
    a magnetic field intensity distribution generator for generating a magnetic field intensity distribution parallel to a plane of the wire in a direction perpendicular to the wire;
    a minimum magnetic field intensity detector for outputting a position of said magnetic field detector where the magnetic field intensity is minimum;
    a spatial resolution characteristic generator for generating a characteristic at different heights from the plane of the wire as a spatial resolution characteristic of said magnetic field detector with respect to the height thereof;

a three-dimensional scanning device for scanning said magnetic field detector along an axis of said wire, an axis of a straight line perpendicular to said wire, and an axis of the height from said plane of the wire; and a position detector for detecting a position of said magnetic field detector.

5. An apparatus according to claim 4, wherein said magnetic field intensity distribution generator comprises a magnetic field intensity distribution generator for linking an output signal from said position detector which detects positional information of said magnetic field detector scanned by said three-dimensional scanning device.

6. An apparatus according to claim 4, wherein said minimum magnetic field intensity detector comprises a minimum magnetic field intensity detector for detecting a position of said magnetic field detector where the magnetic field intensity is minimum.

7. An apparatus according to claim 4, wherein said spatial resolution characteristic generator comprises a spatial resolution characteristic generator for generating a spatial resolution characteristic representative of the relationship between the height of said magnetic field detector and a spatial resolution thereof from said minimum magnetic field intensity detector.

8. An apparatus according to claim 4, wherein said spatial resolution characteristic generator comprises a spatial resolution characteristic generator for generating a spatial resolution characteristic representative of the relationship between the height of said magnetic field detector and a spatial resolution thereof from said minimum magnetic field intensity detector, and outputting the generated spatial resolution characteristic.

9. A magnetic field measuring apparatus comprising:

a magnetic field detector for detecting a magnetic field generated by a current flowing in one of a plurality of parallel wires;

a measuring unit for measuring a magnetic field intensity based on an output signal from said magnetic field detector;

an input unit for entering a pitch of the parallel wires and a spatial resolution characteristic of said magnetic field detector;

a processor for calculating a height of said magnetic field detector from said one of the parallel wires based on said pitch of the parallel wires and said spatial resolution characteristic;

a scanning device for three-dimensionally scanning said magnetic field detector into a position determined by said processor along an axis of said wires, an axis of a straight line perpendicular to said wires, and an axis of the height from said plane of the wires;

a magnetic field intensity distribution generator for generating a magnetic field intensity distribution parallel to a plane of the wires in a direction perpendicular to the wires;

a minimum magnetic field intensity detector for outputting a position of said magnetic field detector where the magnetic field intensity is minimum;

a spatial resolution characteristic generator for generating a characteristic at different heights from the plane of the wires as a spatial resolution characteristic of said magnetic field detector with respect to the height thereof, and outputting the generated characteristic to said input unit; and a position detector for detecting a position of said magnetic field detector.

* * * * *